(12) United States Patent
Gessner

(10) Patent No.: US 6,452,119 B1
(45) Date of Patent: Sep. 17, 2002

(54) ROTARY SWITCH WITH KEYING FUNCTION

(75) Inventor: Heinz Gessner, Hittnau (CH)

(73) Assignee: Elma Electronic AG, Wetzikon (CH)

( * ) Notice: Subject to any disclaimer, the term of this patent is extended or adjusted under 35 U.S.C. 154(b) by 0 days.

(21) Appl. No.: 09/403,535

(22) PCT Filed: Sep. 27, 1997

(86) PCT No.: PCT/DE97/02225
§ 371 (c)(1),
(2), (4) Date: Jan. 24, 2000

(87) PCT Pub. No.: WO98/48435
PCT Pub. Date: Oct. 29, 1998

(30) Foreign Application Priority Data

Apr. 23, 1997 (DE) ..................... 297 07 302 U

(51) Int. Cl.[7] ............................... H01H 19/00
(52) U.S. Cl. ..................... 200/19.18; 335/207
(58) Field of Search ............... 200/28, 19.18, 200/19.36, 327, 565; 335/205, 207; 341/11, 15

(56) References Cited

U.S. PATENT DOCUMENTS 3,585,544 A  *  6/1971  Cleaveland et al. ........ 335/170
3,597,714 A  *  8/1971  Brebbia et al. ............. 335/207
4,199,741 A  *  4/1980  Paulet ...................... 335/206

FOREIGN PATENT DOCUMENTS

DE    2 313 750         10/1974
DE    31 19 227 A1      12/1982
DE    89 10 606         12/1989
DE    297 07 302 U1      7/1997

* cited by examiner

Primary Examiner—P. Austin Bradley
Assistant Examiner—Lisa N Klaus
(74) Attorney, Agent, or Firm—Townsend and Townsend and Crew LLP

(57) ABSTRACT

The invention concerns a manually actuatable rotary switch with keying function for electrical engineering and electronics. The invention essentially consists of an annular magnet, a stator, engaging elements, a shaft, washers, a code disk, a scanning device and a stop. The stator is provided with a cylinder which encompasses an annular magnet. A catching element with an embedded washer, guides for engaging elements, and a code disk are associated with the upper face of the annular magnet and a washer with the lower face. A rotatably mounted and axially sliding shaft which is square with an extension is mounted in the center of the rotary switch. The washers consist of ferromagnetic or soft magnetic material. A scanning device is associated with the code disk and a stop with the washer. The cylinder is constructed as a notched rim with notch elevations and notch countersinks which engage with engaging elements. The engaging elements engage in guides which extend radially. In another embodiment, the stator is provided with a notched rim with notch elevations and notch countersinks on the inner surface of the extension.

9 Claims, 1 Drawing Sheet

ROTARY SWITCH WITH KEYING FUNCTION

TECHNICAL FIELD

The invention relates to a manually actuatable rotary switch with keying function for electrical engineering / electronics.

PRIOR ART

In the field of electrical engineering / electronics the most diverse embodiments of rotary switches are known. For the realisation of switch positions, mechanical rotary detent mechanisms are used, such as are, for example, described in "Bauelemente der Feinwerktechnik" by O. Richter and R. v. Voss, $8^{th}$ edition, Verlagtechnik Berlin, 1959, pages 300–310. For the latching of the switch shaft, latch elements standing under spring action, such as disks, balls, pins etc., or special spring embodiments stand in an operational association with latch wheels or similar components in most embodiments. Furthermore, a magnetic latch is known from the German patent specification 29 03 698 in the most diverse arrangement of the latch elements, such as permanent magnets with multiple poles or with latching noses of magnetisable shaped elements as a rotor or stator in interaction with the oppositely disposed latch element. The position and pitch "T" of the latch recess is associated with the position and pitch "T" of the signal producing unit, whereby signals correspond to latch positions in accordance with a fixed pattern. This corresponds to the generation of defined signals at specific latch positions.

Manually operable key switches are likewise known in different embodiments. They serve to produce a corresponding signal by axial keying. In this respect the sequences of movement required for this purpose are assisted in the most diverse manner. On the one hand, mechanical spring elements, for example cylinder springs, flat shaped springs etc., serve as an energy storing reversal element, mainly in conjunction with contact elements or themselves function as an energy storing element for the production of the timing pulse, mainly in conjunction with different sensors (Hall effect, optoelectronic etc.) as signal generating elements (German laying open print 31 19 227). Furthermore, a keying switch is known, for example, from German laying open print 33 06 507, in the housing of which a permanent magnet axially movable by a magnetically latched key is moved into the range of action of switching elements for the production of electrical or electronic signals, for example of a read contact.

In the same way a switch or pressure contact is known from German laying open print 23 13 750, with an energy store and step position, the axially movable switching member of which stands under the action of a cylinder spring or a ring of elastic material. To assist the spring action, a permanent magnet is secured to the switching member and ensures, in cooperation with a ferromagnetic plate of the apparatus housing, a defined switching point of an electrical contact.

Furthermore, a rotary knob apparatus is known in German utility model 89 10 606.7 for the selection of specific functional modes of an apparatus, in particular of an electronic phoropter, in which a pole disk secured onto an axially shiftable shaft or ferromagnetic material and standing in cooperation with an optoelectronic apparatus with digital further processing of the signals is rotationally latched by a permanent magnet arranged in the housing. A further switching process can be realised by axial shifting of the rotary knob axle. These switching devices are special components and serve for the solution of special tasks, Rotary switches with an additionally integrated possibility for producing a signal by axial movement of the switch shaft have also been realised, with snapping forces and resetting forces being realised by cylinder springs or flat shaped springs. The known switches or switching devices are restricted with respect to their possibilities of use by their size, for example, are frequently not usable in electronics and microelectronics. The durability, reliability and precision of known components or component groups, for example of latch elements and the like for producing a precise snap action, is not achieved.

DESCRIPTION OF THE INVENTION

The invention is based on the object of overcoming the disadvantages of the prior art and of providing a further rotary switch in which precisely latched rotary switching functions and additional keying functions are possible independently of one another, which realises a good tactile acknowledgement and permits a miniturarised manner of construction.

This object is satisfied in accordance with the invention by the characterising feature of the claims 1 to 8.

With the invention precisely latched rotary switching functions and additional keying functions are obtained independently of one another with a compact space saving manner of construction in a component of electrical engineering / electronics, i.e. made possible both independently and also simultaneously. The keying function enables a good tactile acknowledgement. The arrangement of the components and component groups of the switch permit small and smallest embodiments. Its latching operates with low wear and reliably.

BRIEF DESCRIPTION OF THE DRAWING

In the associated drawing there are shown

BEST MODE OF CARRYING OUT THE INVENTION

Figure 1:
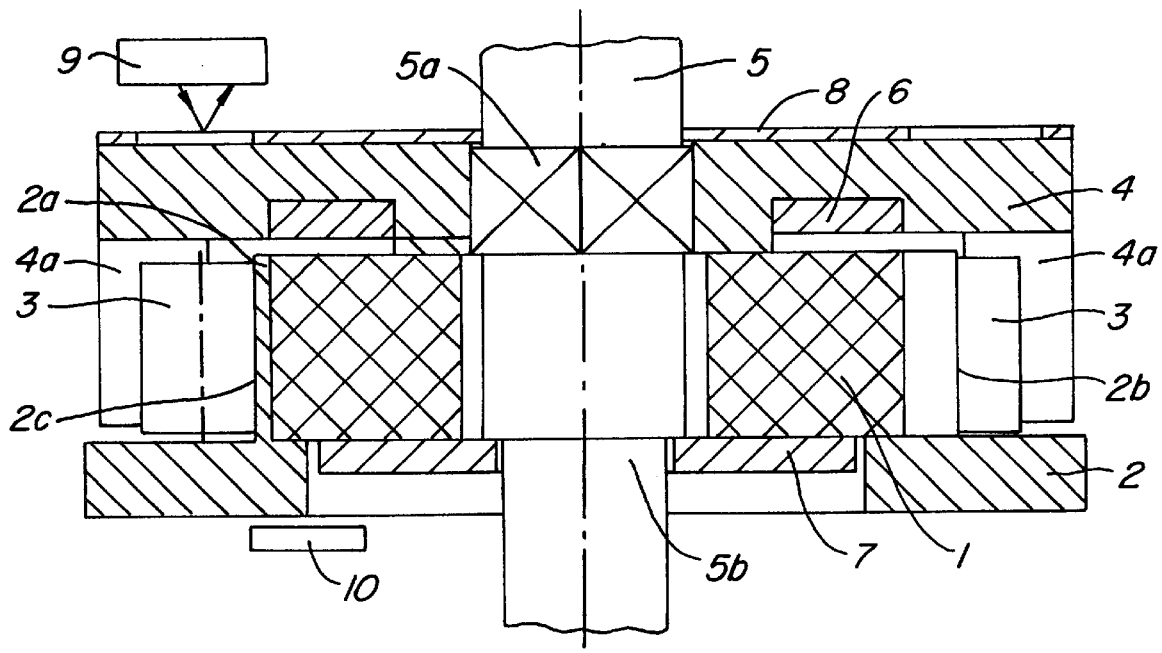
FIG. 1: the invention in section.

The invention consists essentially of a ring magnet 1, a stator 2, latch elements 3, a shaft 5, disks 6; 7, a coding disk 8, a sensing unit 9 and an abutment 10.

As is evident from FIG. 1, a ring magnet 1 is secured in known manner in the cylinder 2a of a stator 2 of the rotary switch or, for example, lightly pressed into it or adhesively bonded to it, the stator being advantageously manufactured of non-magnetic material. The cylinder 2a is formed as a latch ring and provided with raised latch portions 2b and latch recesses 2c, which accommodate roller-like or ball-like latch elements 3, which are held in defined manner by the force of the ring magnet 1. The latch ring has customary forms of known latching gears with any desired pitch, advantageously a pointed tooth arrangement. The latch recess 2c correspond in pitch and position to the number of possible latch positions. It is so shaped that it holds the latch elements 3 latched in a defined position. The raised latch portions 2b determine through their shape and height relative to the latch depression 2c and, in conjunction with the force action of the ring magnet 1, the latching torque and the force characteristics during the switching movement. In this respect each latch recess 2c is so shaped that its wall thickness in the cylinder 2a is as small as possible in order to ideally utilise the force action of the ring magnet 1 without losses, On the other hand, the variation of the wall thickness can be used for the setting of the latch torque. Ring magnets 1 with different force action can naturally be used, An axially displaceable shaft 5 is rotatably mounted at the centre of the rotary switch, and is provided with a square section 5a, or with other technical measures to ensure a form fitted connection, and with a projection 5b. The square section 5a receives the internal square of a driver 4 which lies on the upper end face of the ring magnet 1, and in which a disk 6 of ferromagnetic or soft magnetic material is secured, so that a secure support is ensured by the attractive force of the ring magnet .1. Guides 4a for receiving the ball-like or roller-like latch elements 3 are provided in the driver 4 and permit their radial deflection on switching. An advantageously exchangeable coding disk 8 is secured to the upper surface of the driver 4, which passes through the range of action of an optical sensing unit 9 for the further electrical or electronic evaluation of optical signals. The sensing unit can also be an electronic sensing unit or of a different kind. A disk 7 of ferromagnetic or soft magnetic material is held by the magnetic force at the lower end face of the ring magnet 1. An abutment 10 is associated with the disk 7. During keying, i.e. on depressing the shaft 5, an axial displacement takes place, so that the holding force of the ring magnet 1 is exceeded and the disk 7 breaks away abruptly. A strong positive acceleration of the shaft 5 and the disk 7 takes place in the axial direction up to the abutment 10. When the pressure force on the shaft 5 drops away, the movement of the shaft 5 and disk 7 takes place, as a result of the force action of the ring magnet 1, with reverse acceleration into its starting position, which is perceivable as a snap action, as a tactile acknowledgement. Switching and keying movement of the shaft are possible simultaneously and independently of one another. In an arrangement in which the disk 7 is fixed to the housing and the ring magnet 1 is rotatably journalled on the shaft 5, the ring magnet 1 breaks away from the disk 7 on keying, whereby the same snap action arises. By variation of the thickness and diameter of the disk 7, the acceleration of the shaft 5 and disk 7, and thus the strength of the snap action with tactile acknowledgement to be sensed can be influenced within certain limits.

Figure 2:
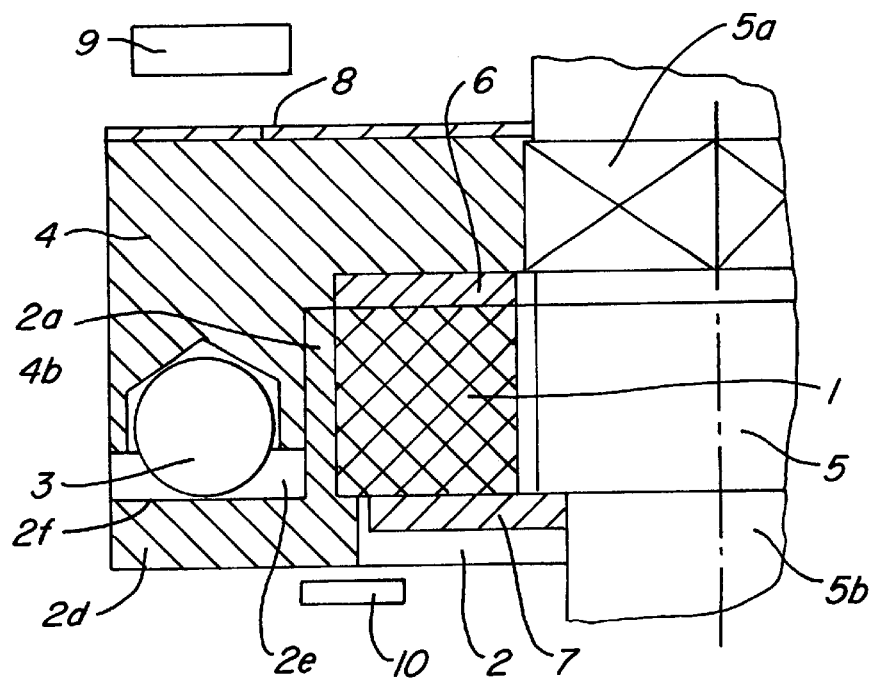
FIG. 2: a further embodiment of the invention in section.

FIG. 2 shows a further embodiment of the switch of the invention. In this arrangement the latch ring with the raised latch portions 2e and the latch recesses 2f is arranged on the inner surface of the projection 2d. The driver 4 is provided with guides 4b, which are advantageously formed as bores which receive the latch elements 3, advantageously balls. The disk 6 is attracted with the driver 4 onto the stator 2 by the force action of the ring magnet 1. On switching, the driver 4 executes an axial shift on the shaft 5 through the stroke movement of the latch elements 3 and is switched on further by one pitch. Magnetic force, size and thickness of the disk 6 and the shape of the latch ring determine the quality of the latching. The switch embodiments of the invention are surrounded by a non-illustrated housing.

COMMERCIAL UTILITY

The invention is commercially utilised in manually actuatable rotary switches with keying function in electrical / electronic apparatuses.

What is claimed is:

1. A rotary switch with mechanical keying function, comprising a sensing unit that cooperates with a coding disk that helps evaluate signals, which is fixed to a rotatable driver, and comprising a stator and a shaft, which allows turning of the driver, the keying function being realized by a ring magnet which is fixed to the stator, by an upper disk of ferromagnetic or soft magnetic material, which is embedded in the driver and by latch elements which are moved by guides of the driver on a circumferential trace of the stator, whereby one of latch recesses or depressions are on the circumferential trace and whereby the ring magnet and the guides are forcing the latch elements along the circumferential trace and into the depressions for positioning the coding disk and driver by magnetic forces of the ring magnet.

2. A rotary switch in accordance with claim 1 further comprising an additional lower disk of ferromagnetic or soft magnetic material, which is held by magnetic forces of the ring magnet for supporting the shaft in a first axial position at a projection allowing the shaft to take another axial position, if the magnetic forces between the lower disk and the ring magnet are overcome.

3. A rotary switch with keying function in accordance with claim 1, wherein the shaft is provided with a square section and a projection.

4. A rotary switch with keying function in accordance with claim 2, further comprising an abutment that cooperates with the lower disk to help limit movement of the coding disk during keying.

5. A rotary switch in accordance with claim 1 wherein the stator includes a cylinder formed as a latching ring, the latching ring including the radially raised latch portions and the latch recesses receiving latch elements.

6. A rotary switch in accordance with claim 5 wherein the guides for receiving the latch elements are radially extending.

7. A rotary switch in accordance with claim 1 wherein the stator is provided with a latching ring with axial latch projections and latch recesses.

8. A rotary switch in accordance with claim 7 further comprising ball-like latch elements arranged in axially extending guides of the driver.

9. A rotary switch in accordance with claim 1 wherein the latch elements are rollers.

* * * * *